May 23, 1961 H. JACOBS ET AL 2,985,757

PHOTOSENSITIVE CAPACITOR DEVICE AND METHOD OF PRODUCING THE SAME

Filed Oct. 5, 1956 2 Sheets-Sheet 1

INVENTORS
HAROLD JACOBS
ALEXANDER P. RAMSA
BY
Campbell, Brumbaugh, Free & Graves
THEIR ATTORNEYS INVENTORS
HAROLD JACOBS
ALEXANDER P. RAMSA
BY
Campbell, Brumbaugh, Free & Graves
THEIR ATTORNEYS 2,985,757

PHOTOSENSITIVE CAPACITOR DEVICE AND METHOD OF PRODUCING THE SAME

Harold Jacobs, West Long Branch, and Alexander P. Ramsa, Neptune, N.J., assignors to Columbia Broadcasting System, Inc., New York, N.Y., a corporation of New York Filed Oct. 5, 1956, Ser. No. 614,175

13 Claims. (Cl. 250—83.3)

This invention relates to photosensitive devices and more particularly to novel electrical capacitance elements which have the property of changing their electrical capacity in response to light impinging thereon.

The photosensitive devices available heretofore have been of several different types and are usually classified on the basis of the particular photoelectric phenomena they exhibit. Perhaps the most common form is the ordinary photoelectric-cell in which electrons are liberated under the influence of light. In another class of these devices, usually termed photovoltaic cells, an E.M.F. is generated by chemical or physical reactions produced by light. In a third group, sometimes designated "photoconductive"-cells, changes in the intensity of the impinging light cause corresponding changes in electrical conductivity. An example of this is the selenium cell, the electrical conductivity of which changes under the action of light.

It is an object of the present invention is to proxide new and improved photosensitive devices in which changes in electrical capacitance are produced in the presence of impinging light.

Another object of the invention is to provide novel compositions of matter that are highly effective in imparting photosensitive properties to dielectrics in photosensitive capacitor devices.

A further object of the invention is to provide novel methods for making compositions of matter that are capable of rendering dielectric materials photosensitive.

The invention may be better understood from the following detailed description, taken in conjunction with the accompanying drawings in which.

Figures 1, 5, 6:
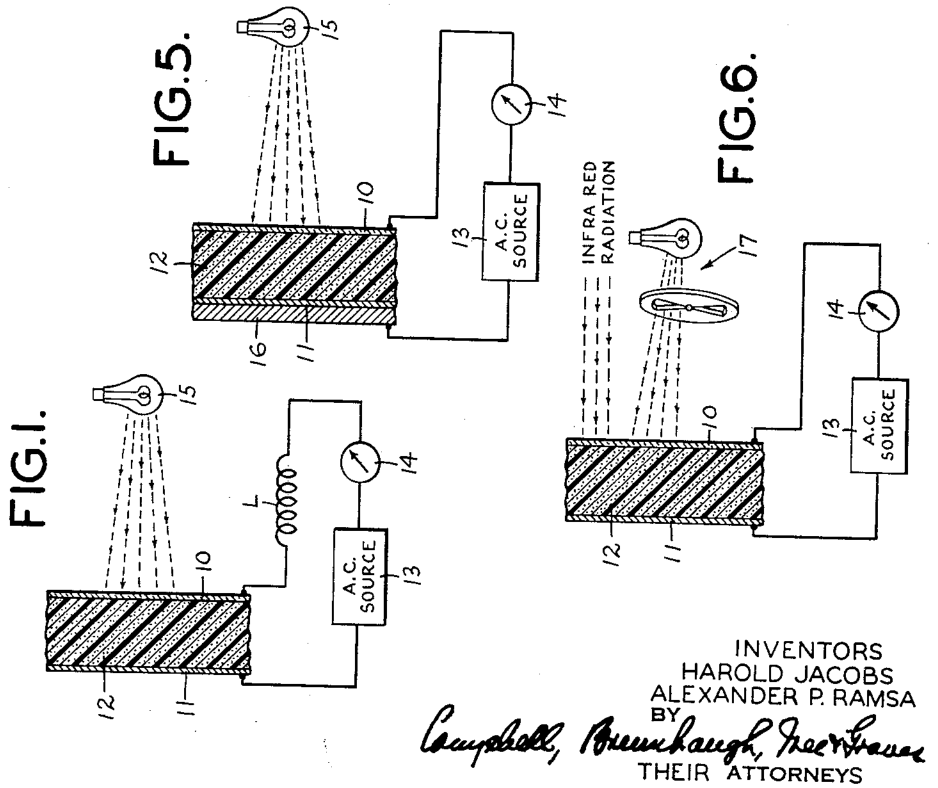
Fig. 1 is a schematic diagram of a typical circuit incorporating a photosensitive capacitor device constructed according to the invention.
Fig. 5 illustrates schematically a light amplifier system embodying a photosensitive capacitor device according to the invention.
Fig. 6 is a schematic diagram of an infrared detector incorporating a photosensitive capacitor device according to the invention.

A typical photosensitive capacitor device according to the invention is shown in Fig. 1. It comprises a transparent conductive plate 10 and a conductive plate 11 separated by a novel form of dielectric composition 12 which is photosensitive according to the invention. The plate 10 may be prepared by known methods, for example, by spraying a sheet of glass with a conductive coating such as stannous chloride. The dielectric composition 12 comprises a suitable dielectric matrix to which has been added a quantity of a novel photosensitive composition described in greater detail below. The plates 10 and 11 of the capacitor are preferably connected in a series resonant circuit including a source 13 of alternating current of high frequency (say 10,000 cycles per sec.) an inductance L and a current indicating instrument (e.g. ammeter) 14. When light from a source 15 is transmitted through the transparent plate 10 and impinges on the dielectric composition 12, it produces a change in the dielectric constant of the latter causing a change in capacitance which is reflected as a marked change in the reading of the ammeter 14 because of the approximately resonant condition of the series circuit.

The dielectric matrix for the dielectric composition 12 may be any one of a number of known dielectric materials. One satisfactory material is unmodified epoxy resin, for example, a material produced by Ciba Pharmaceutical Company under the name "Araldite." This material has an epoxy value of 0.22 to 0.26 equivalents per 100 grams and an esterification value of 0.65 to 0.75 equivalents per 100 grams. Another suitable dielectric material is "Vinylite," a polyvinyl chloride resin produced by the Bakelite Division of Carbide and Carbon Chemical Corporation. Still other suitable dielectric materials include the urea-formaldehyde resins and the phenol-formaldehyde resins.

The dielectric matrix is rendered photosensitive to the desired degree, according to the invention, by incorporating in it a quantity of a mixture of zinc sulfide activated by a small amount of silver or copper, and cadmium sulfide, plus a small, i.e., trace, amount of chloride ion and preferably also certain trace amounts of aluminum and copper compounds described hereinafter. Such a composition may be dispersed or embedded in the dielectric matrix and in this form used as the dielectric 12 between the plates 10 and 11 of the condenser in Fig. 1.

A suitable photosensitive composition of the type indicated generally above may be made by first grinding together several of the ingredients including the zinc sulfide and the cadmium sulfide and optionally also the chloride, such as potassium chloride, to produce fine subdivision and intimate mixing. This may be done, for example, by grinding the material in a ball mill. Thereafter, the mixture is heated at an elevated temperature in an atmosphere containing hydrogen sulfide gas. The temperature employed is high enough to cause diffusion of the trace amounts of chloride and other additives if present into the crystals of cadmium sulfide and activated zinc sulfide. Generally with this purpose in mind, temperatures are maintained above 700° C. At excessively high temperatures, however, the crystal size and structure may be adversely affected, e.g., the crystals may grow to too great a size, thereby impairing the quality of the end product. Therefore, temperatures are generally maintained below 900° C. The heating process is carried out for time sufficient to permit the desired diffusion, which will generally be at least about 15 minutes and as much as about 30 minutes, although the material may be heated for a longer period of time if desired.

After heating, the material, which may have become caked to some extent during the heating process, is subjected to a second grinding which again may be carried out in a ball mill if desired or preferably lightly mortar grinding. The heated material is also washed with a solution having the property of removing salts from the surface of the crystals. For this purpose an aqueous solution of a soluble cyanide, such as potassium or sodium cyanide, suitably a saturated solution, may be employed. The washing operation is also preferably carried out at room temperature. After washing the crystals with the cyanide solution, they are washed with water to remove the cyanide.

Figure 2:
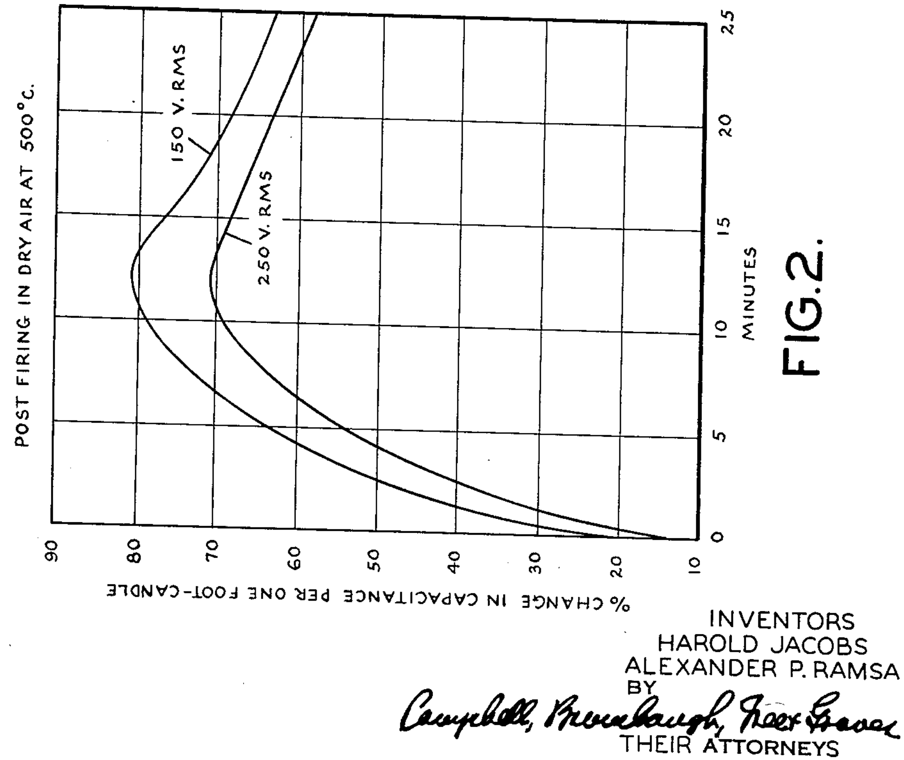
Fig. 2 is a graph illustrating how the photocapacitive effect varies with the time of heating of certain of the compositions formed in accordance with the invention.

The washed crystals are preferably subjected to a post-firing in dry air or hydrogen chloride gas at a temperature in the approximate range 300 to 650° C., and for a time sufficient to bring about a marked increase in the photocapacitive effect. The improvement in photocapacitive effect with time of heating is shown graphically in Fig. 2, which contains a plot of percent change in capacitance per foot-candle vs. heating time in minutes for one of the compositions prepared according to the invention, as described in greater detail hereinafter. Fig. 2 shows that a substantial improvement in photocapacitive effect is realized even with very short post-firing times; that the photocapacitive effect reaches a maximum in the region of 5 to 20 minutes' heating time, and that thereafter there is a gradual decrease in photocapacitive responses. After post-firing, the material is again ground to break up any agglomerates which may have formed.

It is possible to incorporate all of the chloride ion in the crystals during the post-firing treatment by using hydrogen chloride gas as a replacement for part or all of the air. In this case, no chloride need be added in the original mixture.

The basic photosensitive composition prepared as described heretofore is composed essentially of a mixture of silver or copper-activated zinc sulfide and cadmium sulfide containing trace amounts of chloride ion which are important in producing the desired photocapacitive effect. In preparing a condenser as in Fig. 1, they may be mixed with the dielectric matrix material in an amount sufficient to enhance the photocapacitive properties. Generally, at least about 66% by weight of the composition (based on the total weight of the CdS, ZnS composition plus the dielectric material) incorporated or embedded in the dielectric material will be sufficient to produce a notable photocapacitive response. Substantially larger amounts may be used, but it is preferred that the amount of the composition be maintained below about 80% of the total weight of the dielectric material plus CdS, ZnS mixture.

As previously indicated, the photocapacitive composition contains both silver or copper-activated zinc sulfide and cadmium sulfide. The activated zinc sulfides are commercial products containing trace amounts of silver or copper. A silver-activated zinc sulfide containing $10^{-6}$ parts of silver is produced by the E. I. du Pont de Nemours Company as "No. 1410 Phosphor," while a copper-activated zinc sulfide containing $10^{-5}$ to $10^{-6}$ parts of copper is distributed by the U.S. Radium Company as "G105A." They are prepared by calcining the zinc sulfide with one or the other of the metallic trace activating elements.

The ratio of the zinc sulfide to the cadmium sulfide has an effect on the photocapacitive performance of the composition. The molar fraction of zinc sulfide should be at least 0.01, but preferably not greater than about 0.5. The range in which notably superior photocapacitive properties may be expected is about 0.05 to 0.3 molar fraction of zinc sulfide. The effect of varying this ratio is shown graphically in Fig. 3, in which there is plotted the sensitivity of a photocapacitor vs. the molar fraction of zinc sulfide in the composition. The photocapacity was measured by using condensers in which each plate had an area of about 0.78 square inch and a capacity of about 300 micromicrofarads. The intensity of illumination applied to the cells was about 4 foot-candles, originating from a tungsten filament at a temperature of 2850° K. The ordinate represents the increase in current flow in microamperes after light is applied to the condenser, based on the current flow with no light. It will be noted that a curve is presented for each of three frequencies, i.e., 1,000; 10,000 and 15,000 cycles per second, and that each curve has its own optimum concentration of zinc sulfide which produces a maximum photocapacitive sensitivity. Generally, the optimums lie, however, in the range of about 0.05 to 0.3 molar fraction of zinc sulfide.

Figure 3:
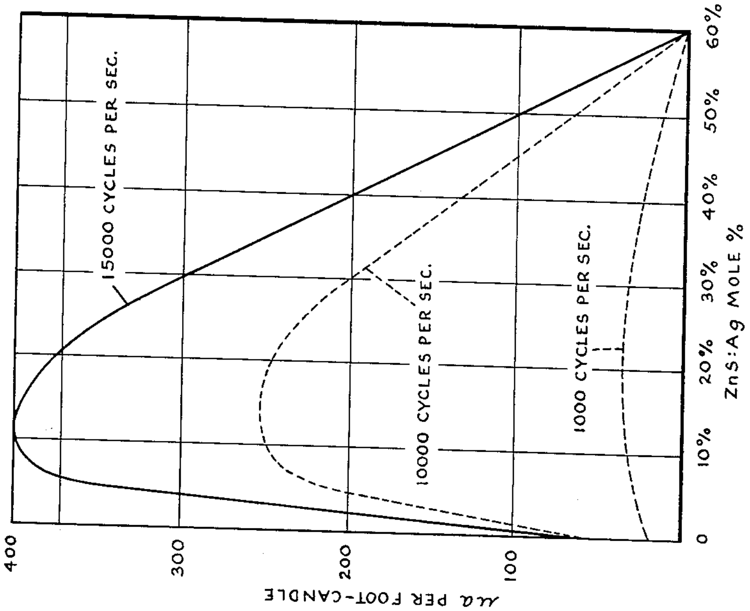
Fig. 3 is a graph illustrating how the photocapacitor sensitivity varies as the ratio of zinc sulfide to cadmium sulfide in the composition is changed.

The compositions tested to secure the data recorded in Fig. 3 were prepared according to the method of the invention heretofore described, by mixing $1\times10^{-3}$ atomic parts of copper in the form of basic copper carbonate ($CuCO_3Cu(OH)_2$); $1\times10^{-3}$ atomic parts of aluminum, as $Al_2O_3$, and $4\times10^{-2}$ moles of KCl together with the activated zinc sulfide and cadmium sulfide. The mixtures were ball-milled for about 3 hours and fired at 815° C. in an atmosphere of hydrogen sulfide for 15 to 20 minutes. After firing, the compositions were mortar-ground and then washed in a saturated solution of potassium cyanide for one hour. Following this step, the material was washed in distilled water for one hour. There was no post-firing in this particular case.

As previously indicated, the chloride ion may be added to the original composition or may be added as a gas during the post-firing treatment. The chloride is thought to act as a flux and to introduce chloride ions into the crystal lattices of the cadmium sulfide and zinc sulfide, which are important in the function of the photocapacitive element. Instead of hydrogen chloride or potassium chloride, any monovalent non-hygroscopic chloride (melting below 800° C.) may be utilized. The chloride preferably has a volatile cation. Examples other than the potassium and hydrogen chlorides include sodium chloride and ammonium chloride. The washing treatment after the initial firing will remove most of the chloride. However, some of the chloride will have penetrated the crystal lattice and will therefore resist removal by washing. It is this trace amount of chloride present in the crystal which contributes to the photocapacitive effect.

Figure 4:
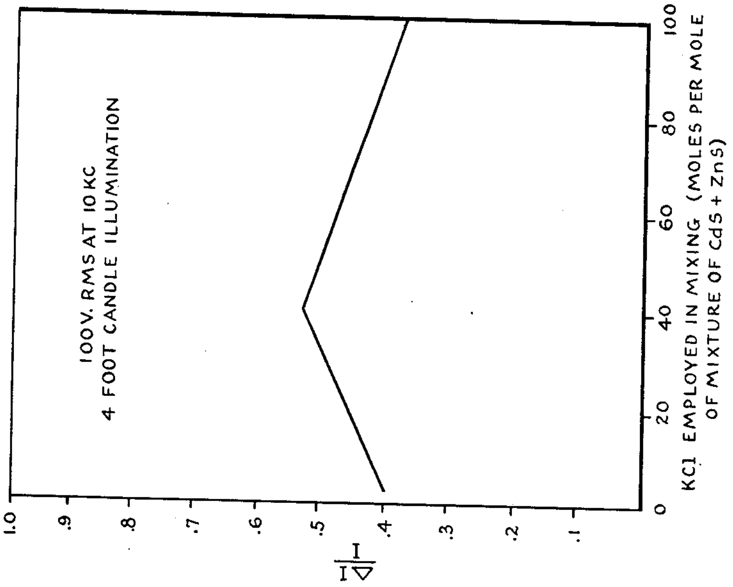
Fig. 4 is a graph showing the effect of adding different amounts of chloride to the mixture.

The effect of adding different amounts of chloride to the mixture which is subjected to firing, washing, etc. is shown in Fig. 4. The compositions tested to give the data recorded in Fig. 4 were made from mixtures having the following basic composition, with varying amounts of potassium chloride:

| | Moles |
|---|---|
| Cadium sulfide | .9 |
| Zinc sulfide (silver-activated) | .1 |
| $Al_2O_3$ | $10^{-3}$ |
| Copper (present as basic carbonate) | $10^{-3}$ |

From the data presented in graphical form in Fig. 4 it is noted that the chloride employed in the mixing was found to be effective in the approximate range of .04 to 1.0 atomic part per mole of CdS plus ZnS mixture, and a maximum was found in the region of .4.

The ingredients in the composition of the invention which are important from the standpoint of producing the desired photocapacitive effect are the cadmium sulfide, the activated zinc sulfide and the chloride. The purpose of the aluminum and copper compounds is to reduce the time lag required for the photocapacitor to assume its normal capacitance after the light has been removed. This time lag in the absence of the aluminum and copper may be of the order of a few minutes to several hours. As will be developed hereinafter, the compositions which contain no aluminum and copper find a particular use in the manufacture of infrared detectors. However, attention will first be directed to photocapacitive compositions and elements containing the aluminum and copper.

The aluminum may be added in the form of any of its compounds. The amount of aluminum compound which is added to reduce the time lag is at least about $1\times10^{-3}$ atomic parts of aluminum per mole of mixture. It may be as high as about $5\times10^{-3}$ atomic parts.

The copper may be added in the form of any of its compounds, such as the chloride, oxide or carbonate. One of the several forms of copper oxide or hydroxide or basic carbonate is a preferred material. It should be added to the composition in an amount corresponding with at least $1 \times 10^{-3}$ atomic parts of copper per mol of mixture and as much as $5 \times 10^{-3}$ parts, and more may be used if desired.

In addition to its use in a light detecting system as in Fig. 1, the photosensitive capacitor device of the invention also may be used in a light amplification system as shown in Fig. 5. That is, the photocapacitor may be placed in a series with an electro-luminescent panel, which may comprise, for example, a coating of electro-luminescent phosphor material 16 over the outside surface of the plate 11 of the capacitor, the connections to the A.C. source 13 being so made that the voltage is impressed across the phosphor and the photosensitive capacitor in series. When the capacitance increases due to the effect of light impinged on the dielectric 12 this causes a decrease in impedance of the condenser and a consequent decrease in voltage drop across it. With a constant voltage applied across the system, the major portion of the E.M.F. drop then will take place across the electroluminescent panel 16, causing a marked increase in the amount of light produced therefrom. By proper choice of the circuit constants according to good engineering practice, it will be understood that for a given illumination of the dielectric 12, a much greater light output from the phosphor 16 can be obtained. In other words, light amplification will occur.

In the absence of the copper and aluminum, as heretofore indicated, the time lags experienced with the photosensitive capacitor of the invention may be exceedingly long. That is, when a condenser having an E.M.F. applied across it is subjected to white light, is assumes a capacitance which persists and does not readily return to its original value after the light is removed. However, if infrared light is impinged upon it, the cell immediately assumes its original capacitance. That is, a short exposure to infrared radiation will quickly bring the capacitor into a high impedance state. This discovery may readily be used as a basis for the use of the capacitors of the invention as detectors of infrared radiation.

For example, if a capacitor having a photosensitive dielectric composition lacking cooper and aluminum is used (Fig. 6) and is illuminated by white light pulses from a light chopper 17, it will function as an effective infrared detector. So long as no infrared light falls on the dielectric 12, there will be essentially no change in the reading of the meter 14. However, as soon as infrared light impinges upon the dielectric 12, the capacitance will change, causing the reading of the meter 14 to change correspondingly.

Although certain embodiments of the invention have been presented in the foregoing description, it will be apparent that modifications may be made within the spirit and scope of the teaching of the specification. Accordingly, it is intended that all modifications and equivalents be included within the scope of the appended claims.

We claim:

1. The method for producing a composition adapted to be used in photocapacitive elements which comprises heating a mixture of about 0.9 molar part of crystalline cadmium sulfide and about 0.1 molar part of crystalline zinc sulfide activated with a metal of the group consisting of copper and silver, at a temperature in the approximate range of 700 to 900° C. in an atmosphere of hydrogen sulfide for a time sufficient to produce interdiffusion of the components of the mixture, and adding to such a mixture a trace amount of a chloride ion sufficient to impart a photocapacitive response thereto.

2. The method for producing a composition adapted to be used in photocapacitive elements which comprises heating a mixture of about 0.9 molar part of crystalline cadmium sulfide, about 0.1 molar part of crystalline zinc sulfide activated with a metal of the group consisting of copper and silver, a trace amount of an aluminum compound, and a trace amount of a copper compound, at a temperature in the approximate range of 700 to 900° C. in an atmosphere of hydrogen sulfide for a time sufficient to produce interdiffusion of the components of the mixture, and adding to such a mixture a trace amount of a chloride ion sufficient to impart a photocapacitive response thereto.

3. The method for producing a composition adapted to be used in photocapacitive elements which comprises grinding together a mixture of about 0.9 molar part of crystalline cadmium sulfide, about 0.1 molar part of crystalline zinc sulfide activated with a metal of the group consisting of copper and silver, about .04 to 1.0 mol of a monovalent non-hygroscopic chloride salt per mol of mixture of zinc sulfide and cadmium sulfide, a trace amount of an aluminum compound that is capable of producing $Al_2O_3$ when heated and a trace amount of a copper compound, heating said mixture at a temperature in the approximate range of 700 to 900° C. in an atmosphere of hydrogen sulfide for a time sufficient to produce interdiffusion of the components of the mixture, and grinding and washing the heated material to remove soluble salts from the surface of the crystals.

4. The method of claim 3 in which the chloride salt is a potassium chloride, the aluminum compound is $Al_2O_3$, and the copper compound is a basic carbonate.

5. The method for producing a composition adapted to be used in photocapacitive elements which comprises grinding together a mixture of about .99 to 0.5 molar part of crystalline cadmium sulfide, about 0.01 to 0.5 molar part of crystalline zinc sulfide activated with a metal of the group consisting of copper and silver, about .04 to 1.0 mol of a monovalent non-hygroscopic chloride salt per mol of mixture of zinc sulfide and cadmium sulfide, a trace amount of an aluminum compound, and a trace amount of a copper compound, heating said mixture at a temperature in the approximate range of 700 to 900° C. in an atmosphere of hydrogen sulfide for a time sufficient to produce interdiffusion of the components of the mixture, grinding and washing the heated material to remove soluble salts from the surface of the crystals, and subjecting the washed material to post-firing in an atmosphere of a gas of the group consisting of air and hydrogen chloride at a temperature in the approximate range of 300 to 650° C. for a time sufficient to bring about an increase in the photocapacitive effect of the product.

6. The method for producing a composition adapted to be used in photocapacitive elements which comprises grinding together a mixture of about .99 to 0.5 molar part of crystalline cadmium sulfide, about 0.01 to 0.5 molar part of crystalline zinc sulfide activated with a metal of the group consisting of copper and silver, a trace amount of an aluminum compound, and a trace amount of a copper compound, heating said mixture at a temperature in the approximate range of 700 to 900° C. in an atmosphere of hydrogen sulfide for a time sufficient to produce interdiffusion of the components of the mixture, grinding and washing the heated material to remove soluble salts from the surface of the crystals, subjecting the washed material to post-firing in an atmosphere of a gas of the group consisting of air and hydrogen chloride at a temperature in the approximate range of 300 to 650° C. for a time sufficient to bring about an increase in the photocapacitive effect of the product, and adding to such a mixture at least one point in the process a trace amount of a chloride ion sufficient to impart a photocapacitive response thereto.

7. The method for producing a composition adapted to be used in photocapacitive elements which comprises grinding together a mixture of about .99 to 0.5 molar part of crystalline cadmium sulfide and about 0.01 to 0.5 molar part of crystalline zinc sulfide activated with a metal of the group consisting of copper and silver, heating said mixture at a temperature in the approximate range range of 700 to 900° C. in an atmosphere of hydrogen sulfide for a time sufficient to produce interdiffusion of the components of the mixture, grinding and washing the heated material to remove soluble salts from the surface of the crystals, subjecting the washed material to post-firing in an atmosphere of a gas of the group consisting of air and hydrogen chloride at a temperature in the approximate range of 300 to 650° C. for a time sufficient to bring about an increase in the photocapacitive effect of the product, and incorporating in the crystals at at least one point in the process a trace amount of a chloride ion sufficient to impart a photocapacitive response thereto.

8. A composition which is capable of producing a photocapacitive response comprising an interdiffused mixture of about 0.9 mole of cadmium sulfide crystals, and about 0.1 mole of zinc sulfide crystals activated with a metal of the group consisting of silver and copper, said crystals containing trace quantities of chloride in amount sufficient to cause the mixture to produce changes in the dielectric constant of a dielectric medium when imbedded in said dielectric medium responsive to light impinged on the dielectric medium.

9. A composition which is capable of producing a photocapacitive response comprising an interdiffused mixture of about 0.9 mole of cadmium sulfide crystals and about 0.1 mole of zinc sulfide crystals activated with a metal of the group consisting of silver and copper, and said crystals containing trace quantities of chloride ion in amount sufficient to cause the mixture to produce changes in the dielectric constant of a dielectric medium when embedded in said dielectric medium responsive to light impinged on the dielectric medium, and trace quantities of copper and aluminum compounds in amount sufficient to decrease the time lag required for the dielectric medium to resume its normal dielectric constant when the light is removed.

10. A mixture of the composition described in claim 8 suspended in a dielectric medium, the amount of the cadmium sulfide-zinc sulfide composition being in the approximate range 66 to 80 percent by weight of the mixture of dielectric material and cadmium sulfide-zinc sulfide composition.

11. A photocapacitive element comprising a thin layer of a mixture described in claim 10 supported between a transparent conductive plate and a second plate.

12. A light detector device comprising a photocapacitive element as described in claim 11 connected to a circuit including a source of relatively high frequency alternating current and an electrical current responsive device.

13. An infra red light responsive device comprising a photocapactive element as described in claim 11 connected to a circuit including a source of relatively high frequency alternating current and an electrical current responsive device, means adapted to direct infra red light and other light to said element, and means for periodically interrupting one of said two forms of light.

References Cited in the file of this patent

UNITED STATES PATENTS

| | | |
|---|---|---|
| 1,997,479 | Burg | Apr. 9, 1935 |
| 2,742,438 | Thomsen | Apr. 17, 1956 |
| 2,745,021 | Kurshan | May 8, 1956 |
| 2,765,385 | Thomsen | Oct. 2, 1956 |
| 2,768,310 | Kazan | Oct. 23, 1956 |
| 2,777,040 | Kazan | Jan. 8, 1957 |
| 2,870,338 | Gillson | Jan. 20, 1959 |

OTHER REFERENCES

The Photo-Conductivity of "Incomplete Phosphors"; The Physical Review; volume 72, Number 7, page 594; October 1, 1947.